United States Patent
Que (10) Patent No.: US 8,261,008 B2
(45) Date of Patent: Sep. 4, 2012

(54) NAND FLASH CONTROLLER AND DATA EXCHANGE METHOD BETWEEN NAND FLASH MEMORY AND NAND FLASH CONTROLLER

(75) Inventor: Jinzhen Que, Fuzhou (CN)

(73) Assignee: Fuzhou Rockchip Electronics Co., Ltd., Fuzhou (CN)

( * ) Notice: Subject to any disclaimer, the term of this patent is extended or adjusted under 35 U.S.C. 154(b) by 581 days.

(21) Appl. No.: 12/246,701

(22) Filed: Oct. 7, 2008

(65) Prior Publication Data

US 2009/0094411 A1 Apr. 9, 2009

(30) Foreign Application Priority Data

Oct. 8, 2007 (CN) .......................... 2007 1 0164187

(51) Int. Cl.
*G06F 13/20* (2006.01)
(52) U.S. Cl. .................. 711/103; 711/E12.008
(58) Field of Classification Search .................. 711/103, 711/E12.008
See application file for complete search history.

(56) References Cited

U.S. PATENT DOCUMENTS

| | | | |
|---|---|---|---|
| 5,490,260 A * | 2/1996 | Miller et al. .................. 711/100 |
| 2003/0217202 A1 | 11/2003 | Zilberman et al. |
| 2004/0255225 A1 * | 12/2004 | Takai .............................. 714/763 |
| 2005/0223131 A1 * | 10/2005 | Goekjian et al. ................. 710/22 |
| 2005/0273551 A1 * | 12/2005 | Keays ............................ 711/103 |
| 2005/0281113 A1 * | 12/2005 | Yada et al. ..................... 365/222 |
| 2007/0088867 A1 * | 4/2007 | Cho et al. ........................ 710/22 |
| 2007/0233955 A1 * | 10/2007 | Luo et al. ...................... 711/115 |
| 2008/0126678 A1 * | 5/2008 | Mizushima ................... 711/103 |
| 2008/0222490 A1 * | 9/2008 | Leung et al. .................. 714/763 |
| 2009/0077445 A1 * | 3/2009 | Honda .......................... 714/752 |

FOREIGN PATENT DOCUMENTS

WO WO-2006/123919 A1 11/2006

\* cited by examiner

*Primary Examiner* — Hal Schnee
(74) *Attorney, Agent, or Firm* — Robert Kinberg; Todd R. Farnsworth (57) ABSTRACT

The invention discloses a NAND flash controller, including a command and address data transmission channel adapted to connect the bus timing interface with the channel selector and transmit command and address data, a data buffer region adapted to receive message data from the bus timing interface through system bus, a control register adapted to receive an operation parameter configured through system bus via the bus timing interface, a logic controller adapted to write the data information into or read the data information from the data buffer region according to the operation parameter, a channel selector adapted to connect the DMA data transmission channel or the command and address data transmission channel according to the operation parameter for transmitting data. The invention also discloses a date exchange method between NAND flash controller and NAND flash memory. The invention improves the data transmission efficiency and is compatible with various NAND flash memories.

10 Claims, 6 Drawing Sheets

NAND FLASH CONTROLLER AND DATA EXCHANGE METHOD BETWEEN NAND FLASH MEMORY AND NAND FLASH CONTROLLER

FIELD OF THE INVENTION

The present invention relates to the field of NAND flash controller, and in particular, to a NAND flash controller and a date exchange method between the NAND flash controller and a NAND flash memory.

BACKGROUND OF THE INVENTION

The NAND flash memory is a nonvolatile semiconductor memory which can be electrically erased and written online. The NAND flash memory has many advantages, such as high erasing and writing speed, low power consumption, large capacity and low cost. The NAND flash memory may be applied in many electronic products, such as MP3, MP4, cell phone, digital camera and video camera. The data is written into or read from the NAND flash memory via the NAND flash controller. The data transmitted to the NAND flash memory includes address and command data and message data. In the prior art, the address and command data and message data are sent to the NAND flash memory via an internal data transmission channel.

Figure 1:
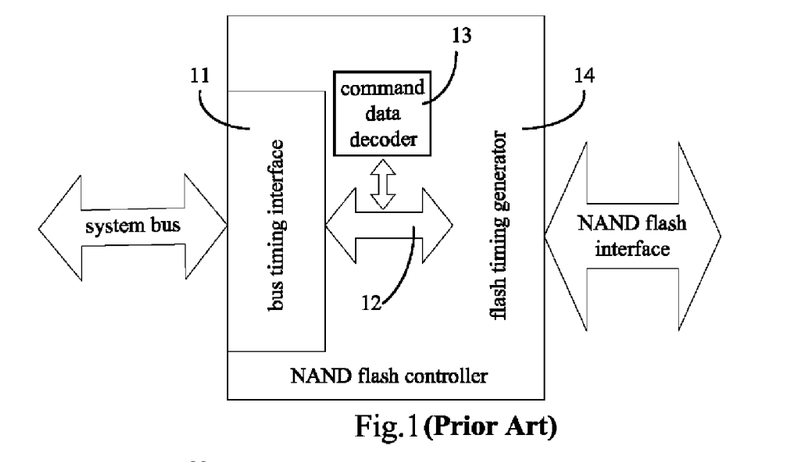
FIG. 1 is a schematic diagram showing the structure of an existing NAND flash controller.

FIG. 1 is a structure diagram showing an existing NAND flash controller. The NAND flash controller includes a bus timing interface 11, an internal data transmission channel 12, a command data decoder 13 and a flash timing generator 14. The bus timing interface 11 directly sends the data transmitted from the system bus to the flash timing generator 14 via the internal data transmission channel 12. The flash timing generator 14 converts the system bus timing into a NAND flash memory timing and sends the data to the NAND flash memory.

The data includes address and command data and message data. When the command data is transmitted in the internal data transmission channel 12, the command data needs to be resolved by the command data decoder 13. After the command data is converted into an actual command, the actual command is sent to the NAND flash memory.

The NAND flash controller is an asynchronous low-speed device. The transmission speed of the NAND flash controller is low and normally less than 40 MHz. However, the transmission speed of the system bus is high and normally up to 133 MHz. During the data transmission, the data from the system bus is always in a waiting state. Moreover, when the command data is transmitted in the internal data transmission channel 12, a conversion operation needs to be performed on the command data by the command data decoder 13. The conversion operation further delays the transmission speed of the NAND FLASH controller and the data transmission efficiency of the NAND flash controller is lowered.

Due to different manufacturers of the NAND flash memory, the value of the command data may be different. Even the manufacturer is the same, different type of NAND flash memories may have different values of the command data. The command data decoder 13 in the NAND flash controller converts different command data in the NAND flash memory from different manufacturers according to the command conversion information stored in the command data decoder 13. However, the command conversion information which may be stored in the command data decoder 13 is finite and it is difficult to include all of the command conversion information in connection with all manufacturers. Moreover, because the NAND flash memory develops rapidly, the solution in which the command data is stored through hardware can not be compatible with the command data which will be put forward in the feature. Thus, the compatibility of the NAND flash controller is limited and it is not flexible to implement the data exchange between the NAND flash controller and different NAND flash memories.

Currently, each page of the NAND flash memory includes two regions: the data region and the redundant region. The data region is adapted to store the data information and the redundant region is adapted to store the file system information and the check bit of the error correcting code. With the data of 2K bytes as an example, the format of the data stored in the NAND flash memory is as shown in table 1.

TABLE 1

| 512 byte | 512 byte | 512 byte | 512 byte | 16 byte | | 16 byte | | 16 byte | | 16 byte | |
|---|---|---|---|---|---|---|---|---|---|---|---|
| Message data 0 | Message data 1 | Message data 2 | Message data 3 | File system information 0 | Check bit 0 | File system information 1 | Check bit 1 | File system information 2 | Check bit 2 | File system information 3 | Check bit 3 |

As shown in table 1, the data region of the data page includes the anterior 2048 bytes and the redundant region of the data page includes the posterior 64 bytes. A BCH codeword includes the message data of 512 bytes and the file system information and check bit of 16 bytes corresponding to the message data of 512 bytes.

When the data is to be written into the NAND flash memory, after the first message data of 512 bytes is written, the address pointer jumps to the fifth column in table 1, thus, the file system information and the check bit corresponding to the first message data of 512 bytes is written. Then, the address pointer jumps to the second column in table 1 and the next message data of 512 is written, then, the address pointer jumps to the sixth column in table 1 so as to write the file system information and the check bit corresponding to the next message data of 512 bytes. In this cycle, the data is written into the storage page of the NAND flash memory. When the data is to be read from the NAND flash memory, the address pointer needs to be adjusted continuously so as to read the data from corresponding position.

In the above procedure in which the data is written into or read from the NAND flash memory, a special instruction and address need to be sent so as to control the address pointer to jump for writing data into or reading data from a corresponding position. Therefore, the complexity of reading data from or writing data into the NAND flash memory is increased and the data transmission efficiency is lowered.

SUMMARY OF THE INVENTION

An object of the present invention is to provide a NAND flash controller which is able to increase the data transmission efficient and is compatible with different NAND flash memories.

Another object of the present invention is to provide a method for writing data into a NAND flash memory so as to decrease the complexity of writing data into the NAND flash memory and increase the data transmission efficiency.

Another object of the present invention is to provide a method for reading data from a NAND flash memory so as to decrease the complexity of reading data from the NAND flash memory and increase the data transmission efficiency.

A NAND flash controller, including a bus timing interface, a flash timing generator, a DMA data transmission channel, a command and address data transmission channel, a channel selector, a data buffer region and a logic controller, wherein, the command and address data transmission channel is adapted to connect the bus timing interface with the channel selector and transmit command and address data;

the data buffer region is adapted to receive message data sent from the bus timing interface through the system bus;

the control register is adapted to receive an operation parameter configured through the system bus via the bus timing interface;

the logic controller is adapted to write the data information into or read the data information from the data buffer region according to the operation parameter;

the channel selector is adapted to connect the DMA data transmission channel or the command and address data transmission channel according to the operation parameter for transmitting data.

Preferably, the NAND flash controller further includes:

a BCH coder/decoder, adapted to implement coding or decoding to the message data transmitted through the DMA data transmission channel and send a coding or decoding result to a BCH result register; and the BCH result register, adapted to store a BCH result data;

wherein, the logic controller reads out the BCH result data from the BCH result register.

Preferably, the NAND flash controller further includes: a flash timing control register, adapted to adjust a timing of the flash timing generator Preferably, the data buffer region includes a plurality of SRAMs with preset bytes and a register with predetermined bytes.

Preferably, the preset bytes is 512 bytes and the predetermined bytes is 64 bytes.

The present invention also discloses a method for writing data into a NAND flash memory by a NAND flash controller, wherein the data takes a BCH code word as unit and writing a data of the BCH code word includes: sending a command and address data to the NAND flash memory; sending data information to an address of the NAND flash memory and coding the data information; sending file system information corresponding to the data information to an adjacent address which is next to the address and coding the file system information; and storing a result data obtained through coding to an address which is next to the adjacent address.

Preferably, before the data information is sent to the address of a storage page of the NAND flash memory, the method further includes: writing the message data and the file system information into a data buffer region of the NAND flash controller through a system bus; and reading the message data and the file system information from the data buffer region in sequence.

Preferably, writing the message data and the file system information into the data buffer region of the NAND flash controller through the system bus includes: cyclically writing the message data into SRAMs of the data buffer region in the NAND flash controller with 512 bytes as unit through the system bus; and cyclically writing the file system information corresponding to the message data into a redundant register of the data buffer region through the system bus.

Preferably, the command and address data is transmitted through a command and address transmission channel by the NAND flash controller.

Preferably, the message data, the file system information and the check bit are transmitted through a DMA data transmission channel by the NAND flash controller.

The present invention further provides a method for reading data from a NAND flash memory by a NAND flash controller, wherein the data takes a BCH code word as unit and reading a data of the BCH code word includes: sending a command and address data to the NAND flash memory; reading data information from an address of a storage page in the NAND flash memory, storing the data information in a data buffer region of the NAND flash controller, and decoding the data information; reading file system information from an adjacent address which is next to the address, storing the file system information in the data buffer region, and decoding the file system information; reading a check bit from an address which is next to the adjacent address, storing the check bit in the data buffer region and decoding the check bit; obtaining result data of decoding and correcting the data information, the file system information and the check bit according to the result data.

Preferably, the method further includes: if the number of errors occurred in the data information, the file system information and the check bit is larger than the number of errors which are able to be corrected, generating error information.

Preferably, the command and address data is transmitted through the command and address transmission channel by the NAND flash controller.

Preferably, the message data, the file system information and the check bit are transmitted through the DMA data transmission channel by the NAND flash controller.

Compared with the prior art, the present invention brings about the following advantages.

According to the NAND flash controller of the present invention, the DMA data transmission channel is used to transmit the message data and the command and address data transmission channel is used to transmit the command and address data. Because the message data, command and address data are transmitted separately, the conversion operation for the command and address data during the transmission can be avoided. Thus, the problem in the prior art, i.e. the command data needs to be stored through hardware and are not compatible with the command data which will be put forward in the feature, may be solved. Therefore, the NAND flash controller may be used for different NAND flash memories flexibly.

According to the present invention, the format of the storage page in the NAND flash memory is that the address of the message data and the address of the corresponding file system information and check bit are arranged in sequence. Therefore, the message data, the file system information and the check bit may be written into or read out in sequence without changing the address pointer with a special operation command and address. Hence, it is facilitated that the BCH coder/decoder performs the coding and decoding, the complexity of the writing data into or reading data from the NAND flash memory is decreased and the data transmission efficiency is further increased.

DETAILED DESCRIPTION OF THE EMBODIMENTS

The NAND flash controller uses the DMA data transmission channel to transmit the message data and uses the command and address data transmission channel to transmit the command and address data, thus, the message data and the command and address data are transmitted separately. Meanwhile, in the present invention, the storage page of the NAND flash memory is that the addresses of the message data and corresponding file system information and check bit are in sequence. When the NAND flash controller exchanges data with the NAND flash memory, the message data, the file system information and the check bit may be written into or read out from the NAND flash memory without special command and address for changing the address pointer.

The above and other objects, features and other advantages of the present invention will be more clearly understood from the following detailed description taken in conjunction with the accompanying drawings as follows.

Figure 2:
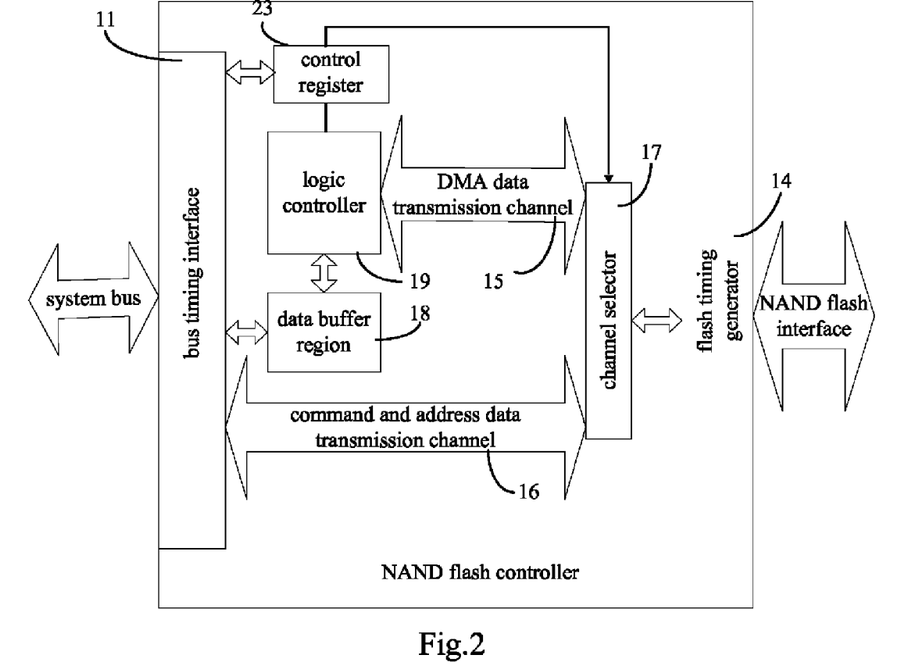
FIG. 2 is a schematic diagram showing the NAND flash controller according to the first embodiment of the present invention.

FIG. 2 is a schematic diagram showing the NAND flash controller according to the first embodiment of the present invention. As shown in FIG. 2, the NAND flash controller includes a bus timing interface 11, a FLASH timing generator 14, a DMA data transmission channel 15, a command and address data transmission channel 16, a channel selector 17, a data buffer region 18, a logic controller 19 and a control register 23.

The bus timing interface 11 is connected with the system bus for implementing the data exchange. The data includes message data and command and address data. The bus timing interface 11 writes the command and address date transmitted on the system bus into the NAND flash memory through the command and address data transmission channel 16, the channel selector 17 and the FLASH timing generator 14. The message data is written into the data buffer region 18 through the bus timing interface 11.

The command and address data transmission channel 16 connects the bus timing interface 11 to the channel selector 17 so as to transmit the command the address data exclusively.

The data buffer region 18 stores the message data transmitted from the bus timing interface 11. The logic controller 19 reads out the message data from the data buffer region 18 and writes the message data into the NAND flash memory through the DMA data transmission channel 15, the channel selector 17 and the FLASH timing generator 14.

The data buffer region 18 may store the message data of code words with a plurality of SRAMs of 512 bytes using a code word of 512 bytes as unit, and store the file system information and the BCH check bit with a register of 64 bytes. The structure is as shown in table 2.

TABLE 2

| SRAM0 of 512 bytes | SRAM1 of 512 bytes | SRAM2 of 512 bytes | SRAM3 of 512 bytes | redundant register of 64 bytes |
|---|---|---|---|---|

The logic controller 19 generates the logic control signal and sends the logic control signal to the channel selector 17. The channel selector 17 connects the DMA data transmission channel 15 or the command and address data transmission channel 16 according to the logic control signal and transmits the data of the channel which is connected to the flash timing generator 14.

The flash timing generator 14 writes the received data into the NAND flash memory. The data register receives the operation parameter configured through the system bus through the bus timing interface 11.

According to the present invention, the DMA data transmission channel 15 is used to transmit the message data and the command and address data transmission channel 16 is used to transmit the command and address data. Because the message data, the command and address data are transmitted separately, the conversion operation for the command and address data during the transmission can be avoided. Thus, the data transmission will not be delayed and the transmission efficiency is improved. Moreover, because the command and address data is transmitted through an exclusive data transmission channel and the conversion operation for the command and address data can be avoided, the NAND flash controller may be compatible with different NAND flash memories.

The NAND flash controller may also include a BCH coder/decoder and a BCH result register so as to implement the coding and decoding for the message data transmitted from the DMA data transmission channel 15.

Figure 3:
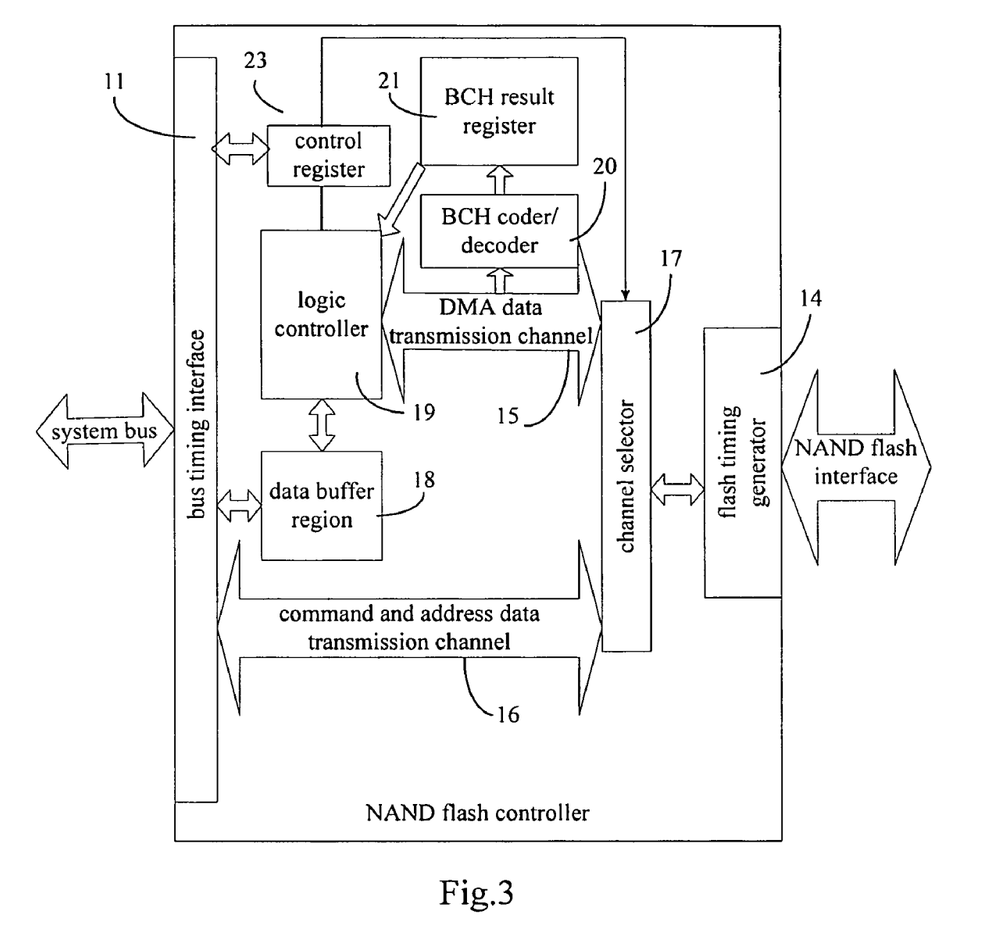
FIG. 3 is a schematic diagram showing the NAND flash controller according to the second embodiment of the present invention.

FIG. 3 is a schematic diagram showing the NAND flash controller according to the second embodiment of the present invention. The NAND flash controller includes a bus timing interface 11, a flash timing generator 14, a DMA data transmission channel 15, a command and address data transmission channel 16, a channel selector 17, a data buffer region 18, a logic controller 19, a BCH coder/decoder 20, a BCH result register 21 and a control register 23.

When the message data is to be written into the NAND flash memory, the BCH coder/decoder 20 performs the coding to the message data and stores the coding result in the BCH result register 21. The logic controller 19 reads the coding result from the BCH result register 21 and writes corresponding check bit into the NAND flash memory through the DMA data transmission channel 15.

When the message data is to be read out from the NAND flash memory, the BCH coder/decoder 20 performs the decoding to the message data and stores the decoding result in the BCH result register 21. The logic controller 19 reads the decoding result from the BCH result register 21 and corrects errors according to the BCH result automatically.

During the coding, the message data and corresponding file system information of each code word need to be input to the BCH coder/decoder 20 in sequence to obtain the coding result. During the decoding, the message data and corresponding file system information and check bit of each code word need to be input to the BCH coder/decoder 20 in sequence to obtain the decoding result.

The BCH result register 21 may store the coding/decoding results of four code words. The structures of the coding/decoding results of the four code words are as shown in table 3.

TABLE 3

| Coding result of code word 0 |
| Coding result of code word 1 |
| Coding result of code word 2 |
| Coding result of code word 3 |

The decoding results of the four code words include four groups of values. Each group of the decoding result includes the number of the errors, the error address and the error value, as shown in table 4.

TABLE 4

| the number of errors |
| error address 0 |
| error value 0 |
| error address 1 |
| error value 1 |
| . |
| . |
| . |
| error address t |
| error value t |

The BCH coding/decoding is implemented on the GF $(2^{13})$ field of the BCH coder/decoder 20. Each group of coding result includes 13*t redundant bits. t denotes the number of the errors which can be corrected. The number of the errors equals to the number of the error bits included in the code word which is found by the BCH coder/decoder 20 through the decoding. Each code word has t errors at most.

Figure 4:
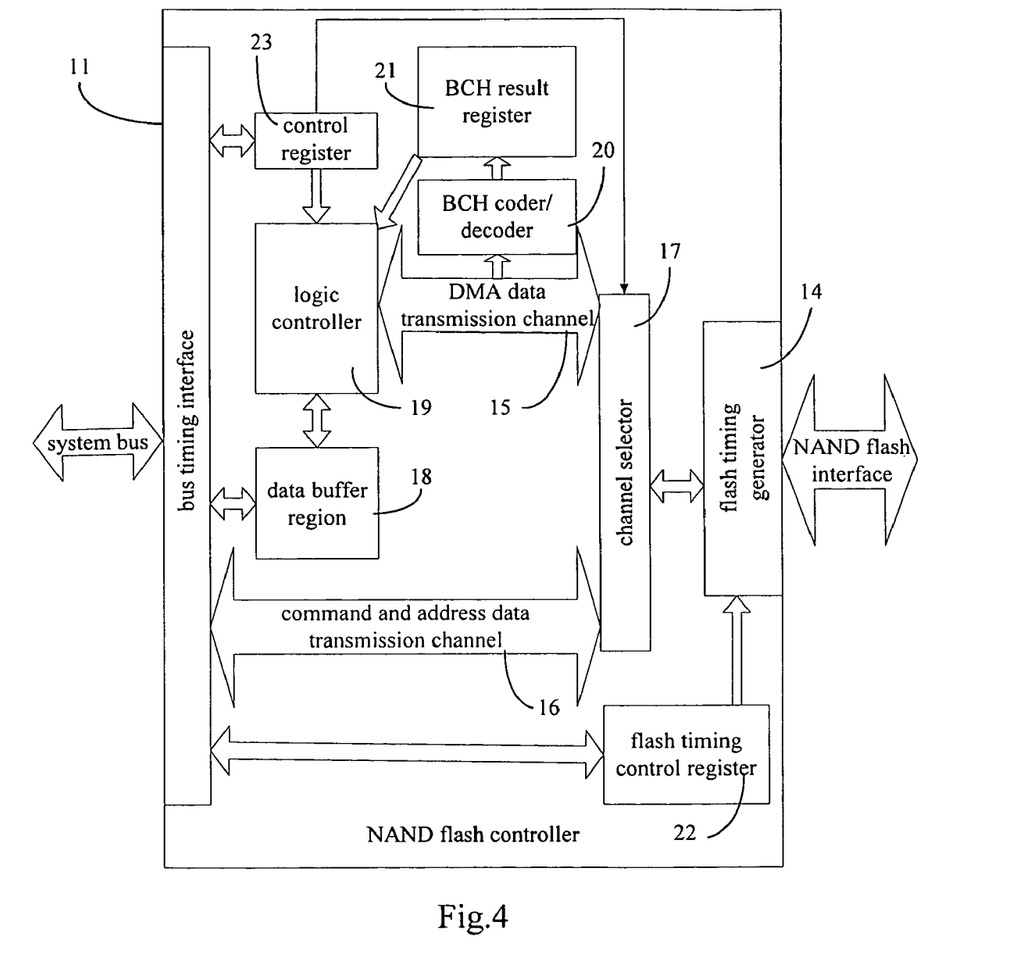
FIG. 4 is a schematic diagram showing the NAND flash controller according to the third embodiment of the present invention.

FIG. 4 is a schematic diagram showing the NAND flash controller according to the third embodiment of the present invention. The NAND flash controller includes a bus timing interface 11, a flash timing generator 14, a DMA data transmission channel 15, a command and address data transmission channel 16, a channel selector 17, a data buffer region 18, a logic controller 19, a BCH coder/decoder 20, a BCH result register 21, a flash timing control register 22 and a control register 23.

The flash timing control register 22 takes the period of the system bus clock HCLK as the time unit to store time values such as the establishment time of the chip selection enable signal, the effective width of the writing/reading signal, the holding time of the chip selection enable signal, the establishment time of the command/address signal and the holding time of the command/address signal.

Because the time values in different NAND flash memories are different, the NAND flash controller sets the time values flexibly so as to be compatible with all NAND flash memories. In practice, the flash timing control register 22 is configured according to the requirements of different NAND flash memories and the flash timing control register 22 adjusts the timing of the flash timing generator 14 according to the time values.

When the NAND flash controller transmits data, the control register 23 is configured through the system bus via the bus timing interface 11 to configure operation parameters, and the logic controller 19 controls all modules operate in combination according to the configured operation parameters and sends the control signal. The channel selector 17 connects the command and address data transmission channel 17 according to the control signal and sends the command and address data to the NAND flash memory. When the data is written into the NAND flash memory, the system bus writes the message data into the data buffer region 18 through the bus timing interface 11, and the logic controller 19 writes the data read from the data buffer region 18 into the NAND flash memory through the DMA data transmission channel 15. After the data of predetermined bytes are transmitted, the logic controller 19 generates interrupt information to inform the system that the data transmission is completed. When the data is read from the NAND flash memory, the logic controller 19 sends the control signal to read the data from the NAND flash memory through the DMA data transmission channel 15 and store the data in the data buffer region 18. After the data of predetermined bytes are transmitted, the logic controller 19 generates the interrupt information to inform the system that the data transmission is completed and then the data is read out from the data buffer region 18 through the system bus via the bus timing interface 11.

Figure 5:
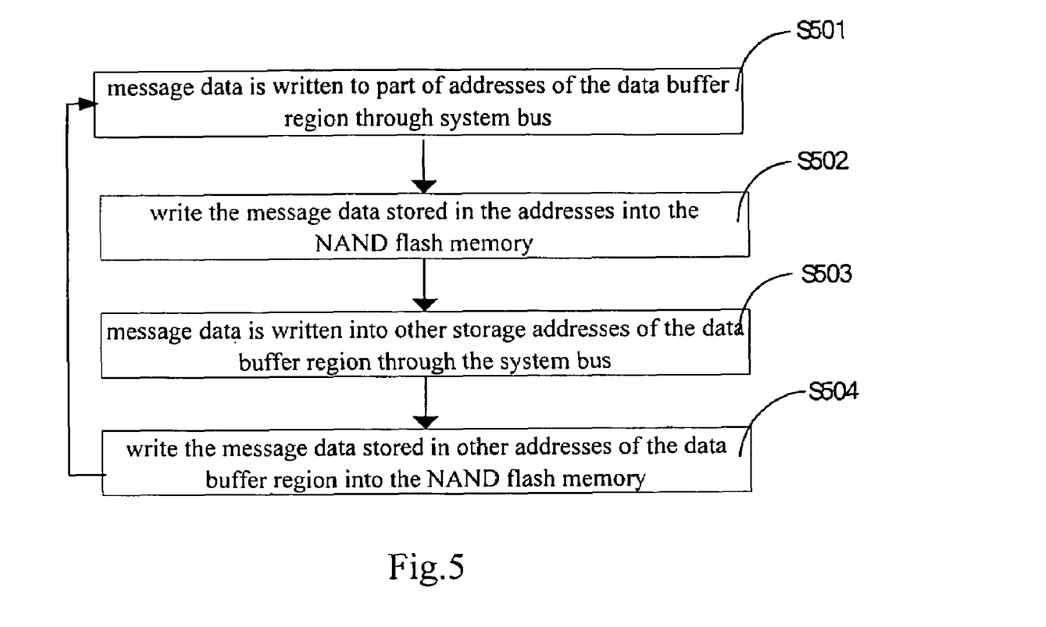
FIG. 5 is a flow chart showing the procedure in which the message data is written into the data buffer region according to the present invention.

Because the plurality of SRAMs and the redundant register of the data buffer region can be addressed through the system bus and the addresses of the SRAMs and the redundant register are in sequence, the operation of writing data into the data buffer region 18 or reading data from the data buffer region 18 may take a code word as unit and the ping pong operation may be adopted. FIG. 5 is a flow chart showing the procedure in which the message data is written into the data buffer region 18 according to the present invention. The procedure includes the following steps.

At step S501, the message data is written to part of addresses of the data buffer region 18 via the bus timing interface 11 through the system bus. For example, the message data is written to the addresses of SRAM0 and SRAM1 in table 2 and corresponding file system information is written to corresponding address of the redundant register in table 2 through the system bus.

At step S502, the logic controller 19 is started through the system bus to writes the message data and the file system information stored in the above addresses of the data buffer region 18 and the check bit in the BCH result register 21 which is obtained via coding into the NAND flash memory. After the writing is completed, the logic controller 19 generates interrupt information to inform the system that the data transmission is completed. For example, the message data stored in the storage address of SRAM0 and SRAM1, corresponding file system information and the check bit are written into the NAND flash memory.

At step S503, the message data is written into other storage addresses of the data buffer region 18 via the bus timing interface 11 through the system bus. For example, the message data is written to the storage addresses of SRAM2 and SRAM3 in table 2. Because the transmission speed of the system bus is faster, step S503 is finished before step S502.

At step S504, the control register 23 is started through the system bus to writes the message data and the file system information stored in above-mentioned other addresses of the data buffer region 18 and the check bit in the BCH result register 21 which is obtained via coding into the NAND flash memory. After the writing is completed, the control register 23 generates interrupt information to inform the system that the data transmission is completed and the flow proceeds to step S501. For example, the message data stored in the storage address of SRAM2 and SRAM3, corresponding file system information and the check bit are written into the NAND flash memory.

The above ping pong operation implements the data transmission with BCH code word as unit and increases the data transmission efficiency by configuring the control register 23 circularly. In addition, the ping pong operation may reduce the requirements for the storage capacity of the data buffer region 18, decrease the area of the NAND flash controller and lower the chip cost.

The NAND flash controller according to the embodiments of the present invention is described as above, and the data storage format of the NAND flash memory will be described in detail as below.

In order to facilitate the data writing and reading, the format of the storage page in the NAND flash memory according to the present invention is that the addresses of the message data and corresponding file system information, and check bit are arranged in sequence. Table 5 shows the format of a 2K storage page in the NAND flash memory according to the present invention.

TABLE 5

| 512 byte | 16 byte | 512 byte | 16 byte | 512 byte | 16 byte | 512 byte | 16 byte |
|---|---|---|---|---|---|---|---|
| Message data0 | File system information 0 | Check bit0 | Message data 1 | File system information 1 | Check bit 0 | Message data 2 | File system information 2 | Check bit 0 | Message data3 | File system information 3 | Check bit 0 |

In table 5, the message data, the file system information and the check bit of each BCH code word are arranged in sequence. When the data is to be written into or read from the NAND flash memory, the message data, the file system information and the check bit may be written into or read out in sequence without changing the address pointer with a special operation command and address. Hence, it is facilitated that the BCH coder/decoder 20 performs the coding and decoding, the complexity of writing data into or reading data from the NAND flash memory is decreased and the data transmission efficiency is further increased.

Based on the above format of the storage page in the NAND flash memory, the present invention also provides a data exchange method between the NAND flash controller and the NAND flash memory to decrease the complexity of writing or reading data and increase the data transmission efficiency. The following description will be given with the procedure in which the NAND flash controller writes the data of 1BCH code word into the NAND flash memory and read the data of 1BCH code word from the NAND flash memory as an example.

Figure 6:
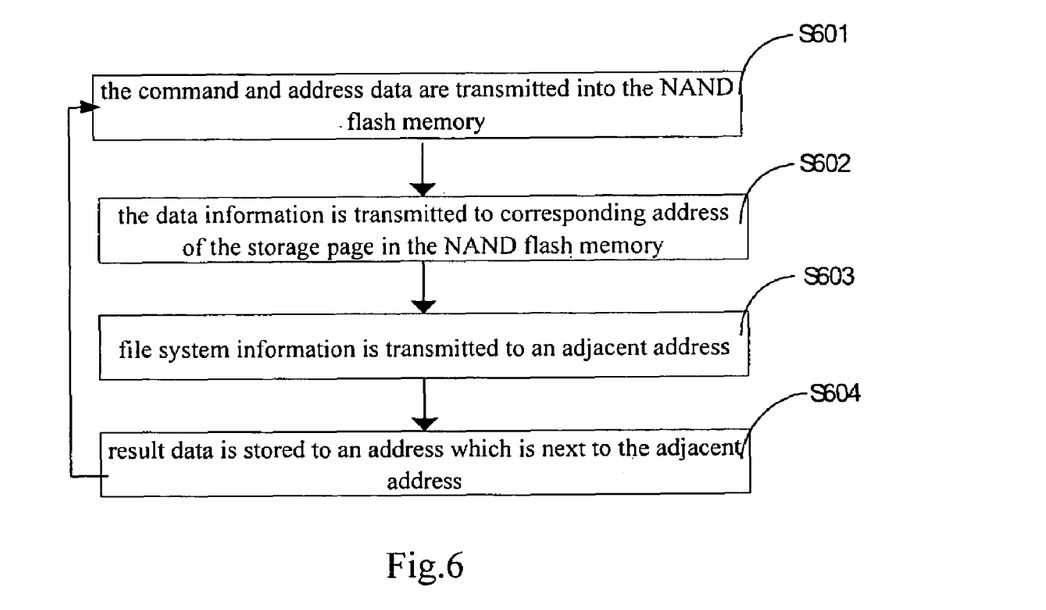
FIG. 6 is a flow chart showing the method for writing the data into the NAND flash memory by the NAND flash controller according to the present invention.

FIG. 6 is a flow chart showing the method for writing the data into the NAND flash memory by the NAND flash controller according to the present invention. The method includes the following steps.

At step S601, the command and address data are transmitted into the NAND flash memory.

The command and address data are transmitted to the NAND flash memory through the system bus via the command and address data transmission channel 16.

At step S602, the data information is transmitted to corresponding address of the storage page in the NAND flash memory and the data information is coded.

The parameters of the control register 23 are configured through the system bus. The logic controller 20 reads the data information in the data buffer region via the DMA data transmission channel 15 and stores the data information to the address of the storage page of the NAND flash memory. Meanwhile, the BCH coder/decoder 20 implements the coding to the data information.

Figure 7:
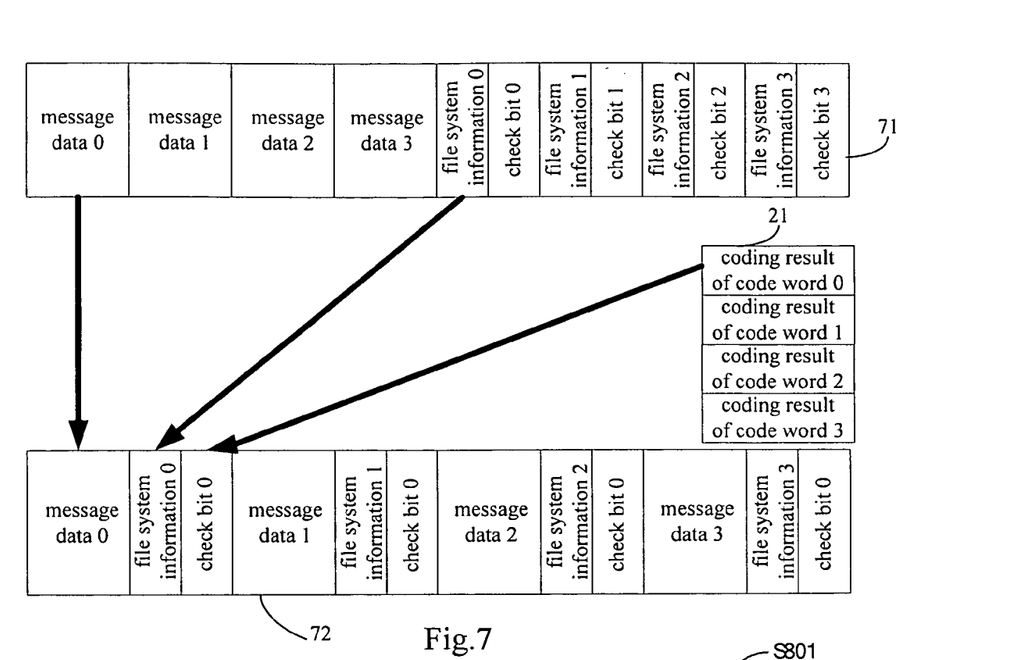
FIG. 7 is a schematic diagram showing the procedure in which the data is written into the NAND flash memory.

FIG. 7 is a schematic diagram showing the procedure in which the data is written into the NAND flash memory. In FIG. 7, the data buffer region register 71, the storage page 72 in the NAND flash memory and the BCH result register 21 are shown. The message data stored in the address of message data 0 of data buffer region register 71 is transmitted to the address of message data 0 of the storage page 72 in the NAND flash memory and is sent to the BCH coder/decoder 20 for coding.

At step S603, the file system information corresponding to the data information is transmitted to an adjacent address which is the next to the address of the message data 0 of the storage page 72 in the NAND flash memory and the file system information is coded.

Referring to FIG. 7, the data stored in the address of the file system information 0 in the redundant register 71 of the data buffer region is transmitted to the address of the file system information 0 in the storage page 72 of the NAND flash memory. As shown in FIG. 7, in the storage page 72 of the NAND flash memory, the address of the message data 0 is adjacent to the address of the file system information 0, thus the file system information is stored to the storage address of the NAND flash memory without changing the storage address of the NAND flash memory. Meanwhile, the file system information is sent to the BCH coder/decoder 20 for coding and the coding result is stored to the coding result address of code word 0 in the BCH result register 21.

At step S604, the result data obtained by coding is further stored to an address which is next to the adjacent address as mentioned in step S603. Thus, the BCH code word is stored in the NAND flash memory. By repeating the above steps, the data are written into the NAND flash memory in sequence.

Referring to FIG. 7, the result data in the coding result of code word 0 in the BCH result register 21 is directly transmitted to the address of the check bit 0 in the storage page 72 of the NAND flash memory. As shown in FIG. 7, the address of the check bit 0 is next to the address of the file system information 0, thus, the coding result is automatically stored in the address of the check bit 0 without changing the storage address of the NAND flash memory.

As can be seen from the above steps, the message data, the file system information and the check bit may be written into the NAND flash memory without changing the storage addresses of the NAND flash memory. Thus, the complexity of writing data into the NAND flash memory is simplified and the data transmission efficiency is further improved.

Figure 8:
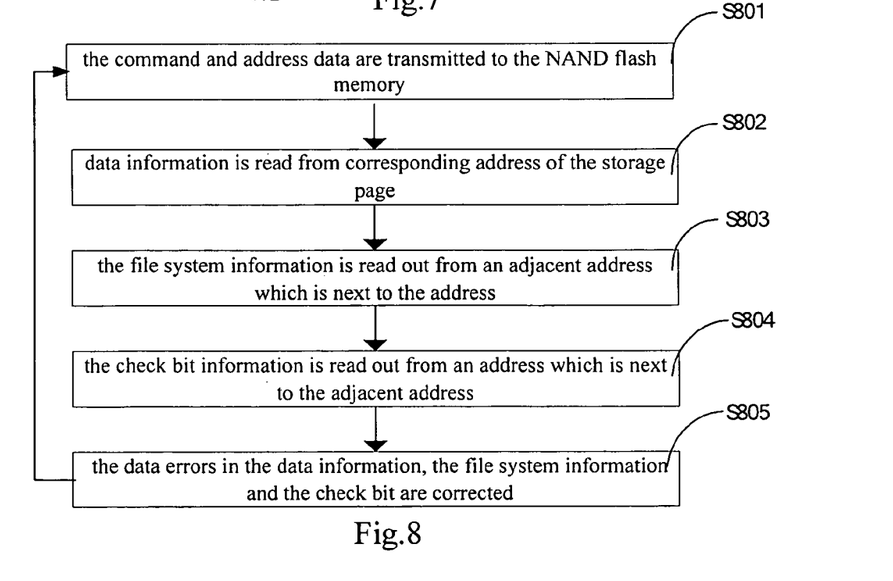
FIG. 8 is a flow chart showing the method for reading the data from the NAND flash memory by the NAND flash controller according to the present invention.

FIG. 8 is a flow chart showing the method for reading the data from the NAND flash memory by the NAND flash controller according to the present invention. The method includes the following steps.

At step S801, the command and address data are transmitted to the NAND flash memory.

The command and address data are transmitted to the NAND flash memory through the system bus via the command and address data transmission channel 16.

At step S802, the parameters of the control register 21 are configured through the system bus. The logic controller 19 is started to read data information from corresponding address of the storage page in the NAND flash memory through the DMA data transmission channel 15 and store the data information in the data buffer region 18. Meanwhile, the BCH decoder implements the decoding of the data information.

Figure 9:
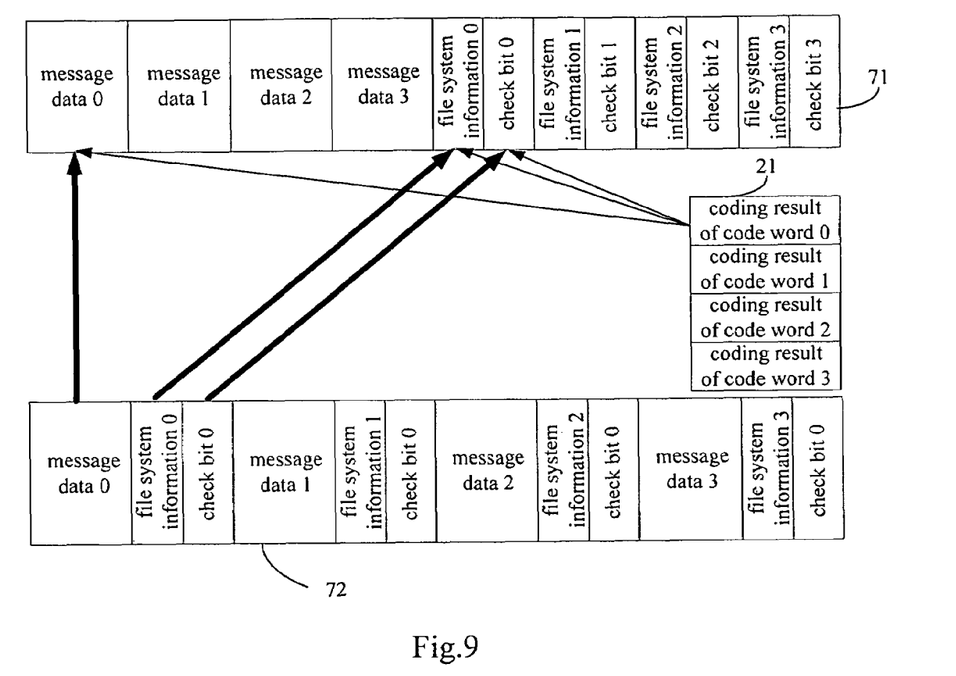
FIG. 9 is a schematic diagram showing the procedure in which the data is read from the NAND flash memory.

FIG. 9 is a schematic diagram showing the procedure in which the data is read from the NAND flash memory. In FIG. 9, the data buffer region register 71, the storage page 72 in the NAND flash memory and the BCH result register 21 are shown. The message data is read from the address of message data 0 of the storage page 72 in the NAND flash memory and is transmitted to the address of message data 0 of the data buffer region register 71. Meanwhile, the message data is also sent to the BCH coder/decoder 20 for decoding.

At step S803, the file system information is read out from an adjacent address which is next to the address of the message data 0 of the storage page 72 in the NAND flash memory and the file system information is stored in the data buffer region 18. Meanwhile, the BCH coder/decoder 20 decodes the file system information.

Referring to FIG. 9, the address pointer of the NAND flash memory moves to a next address. Then, the data in the address of the file system information 0 is read out and sent to the address of the file system information 0 in the data buffer region register 71. Meanwhile, the file system information is sent to the BCH coder/decoder 20 for decoding.

At step S804, the check bit information is read out from an address which is next to the adjacent address mentioned in step S803 and stored in the data buffer region 18. Meanwhile, the BCH coder/decoder 20 decodes the check bit.

Referring to FIG. 9, the address pointer of the NAND flash memory further moves to a next address. Thus, the data in the address of the check bit 0 is read out and sent to the address of the check bit 0 in the data buffer region register 71. Meanwhile, the check bit is sent to the BCH coder/decoder 20 for decoding.

At step S805, the logic controller 19 obtains the result data which is obtained through decoding and corrects the data errors in the data information, the file system information and the check bit in the data buffer region 18. By repeating the above steps, the data is read out from the NAND flash memory in sequence.

Referring to FIG. 9, the result data is read out from the address of decoding result for code word 0 in the BCH result register 21. According to the result data, the errors in the code word are corrected automatically. If the number of the errors occurred in the data information, the file system information and the check bit is larger than the number of the errors which can be corrected, the error information is generated.

The message data, the file system information and the check bit may be read from the NAND flash memory without changing the storage addresses of the NAND flash memory. Thus, the complexity of reading data from the NAND flash memory is simplified and the data transmission efficiency is improved.

The NAND flash controller and the data exchange method between the NAND flash controller and the NAND flash memory are described in detail as above. The principal and the embodiments of the present invention are disclosed. Although the present invention has been disclosed as above with reference to preferred embodiments thereof but will not be limited thereto. Those skilled in the art can modify and vary the embodiments without departing from the scope of the present invention.

What is claimed is:

1. A NAND flash controller, comprising a bus timing interface, a flash timing generator, a DMA data transmission channel, a command and address data transmission channel, a channel selector, a data buffer region, a control register and a logic controller, wherein, the command and address data transmission channel is adapted to connect the bus timing interface with the channel selector and transmit command and address data;
the data buffer region is adapted to receive message data sent from the bus timing interface through a system bus;
the control register is adapted to receive an operation parameter configured through the system bus via the bus timing interface;
the DMA data transmission channel is adapted to connect the logic controller with the channel selector and transmit the message data;
the logic controller is adapted to write the message data into or read the message data from the data buffer region according to the operation parameter received from the control register, and generate a logic control signal and send the logic control signal through the DMA data transmission channel to the channel selector; and
the channel selector is adapted to connect the DMA data transmission channel or the command and address data transmission channel according to the logic control signal received from the logic controller for transmitting data.

2. The NAND flash controller according to claim 1, further comprising:
a Bose, Ray-Chaudhuri and Hocquenghem, BCH, coder/decoder, adapted to implement coding or decoding to the message data transmitted through the DMA data transmission channel and send a coding or decoding result to a BCH result register; and
the BCH result register, adapted to store a BCH result data;
wherein, the logic controller reads out the BCH result data from the BCH result register.

3. The NAND flash controller according to claim 1, further comprising:
a flash timing control register, adapted to adjust a timing of the flash timing generator.

4. The NAND flash controller according to claim 1, wherein, the data buffer region comprises a plurality of SRAMs with preset bytes and a register with predetermined bytes.

5. The NAND flash controller according to claim 4, wherein, the preset bytes is 512 bytes and the predetermined bytes is 64 bytes.

6. A method for writing data into a NAND flash memory by a NAND flash controller, wherein a Bose, Ray-Chaudhuri and Hocquenghem, BCH, code word is taken as a unit of data transfer and writing a data of the BCH code word comprises:
sending a command and address data to the NAND flash memory;
sending message data to an address of the NAND flash memory and coding the message data;
sending file system information corresponding to the message data to an adjacent address which is next to the address and coding the file system information; and
storing a result data obtained through coding to an address which is next to the adjacent address;

wherein the command and address data, and the message data and the file system information are transmitted to the NAND flash memory through different channels by the NAND flash controller:

the command and address data is transmitted from a system bus to the NAND flash memory without a conversion operation through an exclusive command and address transmission channel by the NAND flash controller, but the message data and the file system information are transmitted to the NAND flash memory through a DMA data transmission channel by the NAND flash controller.

7. The method according to claim 6, before the message data is sent to the address of a storage page of the NAND flash memory, further comprising:

writing the message data and the file system information into a data buffer region of the NAND flash controller through the system bus; and reading the message data and the file system information from the data buffer region in sequence.

8. The method according to claim 7, wherein, writing the message data and the file system information into the data buffer region of the NAND flash controller through the system bus comprises:

cyclically writing the message data into SRAMs of the data buffer region in the NAND flash controller where 512 bytes is taken as a unit of data transfer through the system bus; and cyclically writing the file system information corresponding to the message data into a redundant register of the data buffer region through the system bus.

9. A method for reading data from a NAND flash memory by a NAND flash controller, wherein a Bose, Ray-Chaudhuri and Hocquenghem, BCH, code word is taken as unit of data transfer and reading a data of the BCH code word comprises:

sending a command and address data to the NAND flash memory;

reading message data from an address of a storage page in the NAND flash memory, storing the message data in a data buffer region of the NAND flash controller, and decoding the message data;

reading file system information from an adjacent address which is next to the address, storing the file system information in the data buffer region, and decoding the file system information;

reading a check bit from an address which is next to the adjacent address, storing the check bit in the data buffer region and decoding the check bit;

obtaining result data of decoding and correcting the message data, the file system information and the check bit according to the result data;

wherein the command and address data, and, the message data, the file system and the check bit information are transmitted to the NAND flash memory through different channels by the NAND flash controller:

the command and address data is transmitted from a system bus to the NAND flash memory without a conversion operation through an exclusive command and address transmission channel by the NAND flash controller, but the message data, the file system information and the check bit are transmitted to the NAND flash memory through a DMA data transmission channel by the NAND flash controller.

10. The method according to claim 9, further comprising:

if a number of errors occurred in the message data, the file system information and the check bit is larger than the number of errors which are able to be corrected, generating error information.

* * * * *